(12) United States Patent
Rasalingam et al.

(10) Patent No.: US 12,382,588 B2
(45) Date of Patent: Aug. 5, 2025

(54) PRINTED CIRCUIT BOARD HAVING A TEMPERATURE PROFILING CONNECTION PAD

(71) Applicant: Sandisk Technologies, Inc., Milpitas, CA (US)

(72) Inventors: Uthayarajan A/L Rasalingam, Penang (MY); Choo Par Tan, Penang (MY); Mathavan Valu, Pulau Pinang (MY)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/360,094

(22) Filed: Jul. 27, 2023

(65) Prior Publication Data

US 2024/0414851 A1    Dec. 12, 2024

Related U.S. Application Data

(60) Provisional application No. 63/507,507, filed on Jun. 12, 2023.

(51) Int. Cl.
| | |
|---|---|
| *H05K 3/34* | (2006.01) |
| *B23K 1/00* | (2006.01) |
| *H05K 1/02* | (2006.01) |
| *H05K 1/11* | (2006.01) |
| *B23K 101/42* | (2006.01) |

(52) U.S. Cl.
CPC ......... *H05K 3/3436* (2013.01); *B23K 1/0016* (2013.01); *H05K 1/0268* (2013.01); *H05K 1/111* (2013.01); *B23K 2101/42* (2018.08); *H05K 1/0266* (2013.01); *H05K 2203/163* (2013.01)

(58) Field of Classification Search
CPC .... H05K 3/3436; H05K 1/0268; H05K 1/111; H05K 3/0266; H05K 1/0016
See application file for complete search history.

(56) References Cited

U.S. PATENT DOCUMENTS

| | | | | |
|---|---|---|---|---|
| 4,956,602 A | * | 9/1990 | Parrish | G01R 31/2831 |
| | | | | 257/E21.526 |
| 5,258,648 A | * | 11/1993 | Lin | H01L 24/97 |
| | | | | 439/91 |
| 6,081,429 A | * | 6/2000 | Barrett | G01R 1/0416 |
| | | | | 439/70 |

(Continued)

FOREIGN PATENT DOCUMENTS

TW    M451664 U  *  4/2013  ............. H01L 27/00

*Primary Examiner* — Ida M Soward
(74) *Attorney, Agent, or Firm* — DENTONS Durham Jones Pinegar

(57) ABSTRACT

A printed circuit board (PCB) includes an identified temperature profiling location. The identified temperature profiling location may be a connection pad from a grid of connection pads on the PCB. The connection pad may be located near a center of the grid of connection pads. The connection pad may be coupled to a no-connect pin of an electronic component that is surface mounted to the PCB. Traces extend from the connection pad to test pads provided near a perimeter of the grid of connection pads. A temperature measurement device may be coupled to the test pads, which enables the temperature measurement device to capture accurate temperature readings underneath the electronic component during a reflow profiling process.

20 Claims, 6 Drawing Sheets

(56) References Cited

U.S. PATENT DOCUMENTS

| | | | |
|---|---|---|---|
| 6,452,807 B1* | 9/2002 | Barrett | G01R 1/0416 |
| | | | 361/767 |
| 6,469,530 B1* | 10/2002 | Johnson | H05K 1/0268 |
| | | | 324/750.25 |
| 6,564,986 B1* | 5/2003 | Hsieh | G01R 31/2812 |
| | | | 228/103 |
| 7,915,718 B2* | 3/2011 | Lee | H01L 23/5383 |
| | | | 257/668 |
| 10,651,099 B2* | 5/2020 | Abraham | G01R 31/31713 |
| 2008/0206904 A1* | 8/2008 | McCarthy | G11C 29/48 |
| | | | 438/15 |
| 2011/0084720 A1* | 4/2011 | Wu | G01R 1/0483 |
| | | | 324/757.02 |
| 2017/0194411 A1* | 7/2017 | Park | H10K 50/846 |
| 2022/0199517 A1* | 6/2022 | Dabral | H01L 23/522 |

* cited by examiner

PRINTED CIRCUIT BOARD HAVING A TEMPERATURE PROFILING CONNECTION PAD

CROSS-REFERENCE TO RELATED APPLICATIONS

The present application claims priority to U.S. Provisional Application 63/507,507 entitled "PRINTED CIRCUIT BOARD FOR A REFLOW PROFILING PROCESS", filed Jun. 12, 2023, the entire disclosure of which is hereby incorporated by reference in its entirety.

BACKGROUND

Surface mount technology (SMT) is a process in which electronic components are mounted on a surface of a printed circuit board (PCB). In one example, solder paste is printed on the PCB and an electronic component is placed on the solder paste. In another example, the electronic component includes a ball grid array (BGA) that couples the electronic component to the PCB. Once the electronic component is surface mounted to the PCB, a reflow soldering process is used to create a bond between the electronic component and the PCB. For example, during the reflow soldering process, the solder paste or the solder balls of the BGA are melted and subsequently cooled to create a solder joint between the electronic component and the PCB.

Reflow profiling is an important part of the SMT process. Reflow profiling includes monitoring and controlling the temperature during the reflow soldering process to help ensure solder joints are correctly formed between the electronic component and the PCB. Reflow profiling typically includes using a thermocouple to obtain temperature data at several test points on the PCB.

For example, thermocouple wires are placed or attached to the various test points on the PCB. However, some of the test points are positioned below or beneath the electronic component. In order to obtain temperature data from these test points, a hole is drilled into the PCB and the thermocouple wires are threaded through the hole. However, this process damages the PCB, which may render it unusable. Additionally, it is difficult to determine whether thermocouple wires have made contact with the test point. As such, inaccurate temperature readings may be taken.

Accordingly, it would be beneficial for a PCB to have features that enable accurate temperature readings at various test points during reflow profiling.

SUMMARY

The present application describes a printed circuit board (PCB) having an identified or predetermined temperature profiling location. In an example, the identified or predetermined temperature profiling location is associated with a connection pad from a grid of connection pads on the PCB. In an example, the identified connection pad is located at or near a center of the grid of connection pads. Additionally, the identified connection pad may be a connection pad that will be coupled to, or otherwise be associated with, a no-connect pin of an electronic component that is surface mounted to the PCB.

In an example, one or more traces extend from the identified connection pad to one or more test pads provided at or near a perimeter of the grid of connection pads. A temperature measurement device may be coupled to the one or more test pads during a reflow soldering process to obtain accurate temperature data associated with the identified connection pad.

Accordingly, the present application describes a PCB that includes a grid of connection pads. In an example, each connection pad of the grid of connection pads is adapted to receive a corresponding connection point from a grid of connection points associated with an electronic component when the electronic component is surface mounted to the PCB. A test pad is positioned at a perimeter of the grid of connection pads. The test pad acts as an attachment point for a temperature measurement device. A trace extends from an identified connection pad of the grid of connection pads to the test pad.

The present application also describes a method for measuring a temperature of solder or another connection mechanism during a reflow soldering process. In an example, the method includes surface mounting an electronic component, having a grid of connection points, to a PCB. The PCB has a corresponding grid of connection pads. A temperature measurement device is coupled to test pads provided on a perimeter of the grid of connection pads. In an example, the test pads are electrically coupled to traces extending from an identified connection pad of the grid of connection pads. A reflow soldering process is performed. A temperature of a connection point associated with the identified connection pad is measured during the reflow soldering process using the temperature measurement device.

In another example, a PCB is described. The PCB includes a grid of connection means. The grid of connection means is adapted to receive interconnection means associated with an integrated circuit. A testing means is positioned at a perimeter of the grid of connection means. In an example, the testing means is adapted to receive wires of a temperature measurement means. A conducting means extends from an identified connection means of the grid of connection means to the testing means. In an example, the identified connection means is located proximate to a center of the grid of connection means.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1:
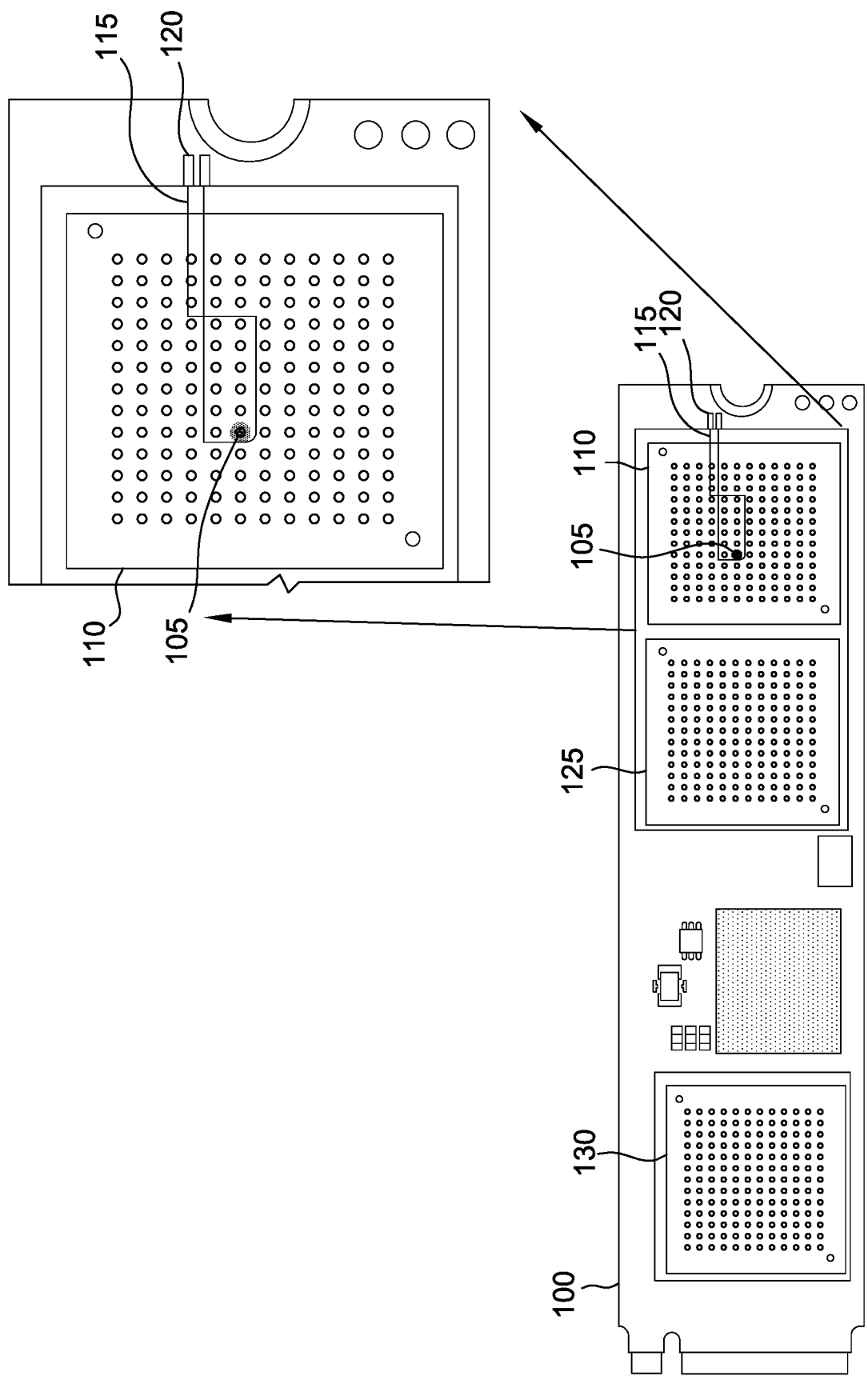
FIG. 1 illustrates a printed circuit board (PCB) having a connection pad that is identified as a temperature profiling connection pad according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

Surface mount technology (SMT) is a process in which electronic components are mounted on a surface of a printed circuit board (PCB). During a SMT process, solder paste is printed on the surface of the PCB and an electronic component is placed on the solder paste. In another example, the electronic component may include a ball grid array (BGA) that is used to couple the electronic component to the PCB. Once the electronic component has been placed on the surface of the PCB, a reflow soldering process is used to create a bond between the electronic component and the PCB. For example, during the reflow soldering process, the solder (either the solder paste or the solder balls of the BGA) is melted and subsequently cooled to create the bond between the electronic component and the PCB.

Reflow profiling is an important aspect of a SMT process. Reflow profiling includes monitoring and controlling a temperature profile during the reflow soldering process. If the temperature is not properly controlled and/or monitored, the solder joints between the PCB and the electronic component may not form correctly. This may lead to tombstoning, voiding, poor solder paste melt, dewetting and other solder issues.

Current reflow profiling techniques include collecting temperature data using thermocouple wires attached to several test points on the PCB. However, some of the test points are underneath the electronic component that is (or will be) surface mounted to the PCB. Accordingly, to measure the temperature at these test points, a hole is drilled into the bottom of the PCB and thermocouple wires are threaded through the hole and attached to the test points. Holes in the PCB may render the PCB unusable. As such, the PCB may subsequently be destroyed after a single use.

In another example, thermocouple wires are attached to various other test points using an epoxy or tape. However, temperatures measurements taken at these test points may not be accurate (e.g., due to the way in which the thermocouple wires are coupled to the test points). As such, these measurements may need to be adjusted after the reflow profiling process.

In order to address the above, the present application describes a PCB having an identified or predetermined temperature profiling location. In an example, the identified or predetermined temperature profiling location is associated with a connection pad from a grid of connection pads on the PCB. Although a connection pad from a grid of connection pads is specifically mentioned, the various concepts described herein may be used on or with any type of pad or connection area of a substrate or a PCB for which solder is used to connect an electronic component.

In an example, the identified connection pad is located at or near a center of the grid of connection pads. Additionally, the identified connection pad may be a connection pad that will be coupled to, or is otherwise associated with, a no-connect pin (or a floating pin) of an electronic component that will be surface mounted to the PCB.

In an example, one or more traces extend from the identified connection pad to one or more test pads provided at or near a perimeter of the grid of connection pads. A temperature measurement device (e.g., a thermocouple) may be coupled to the one or more test pads. Accordingly, accurate temperature measurements may be taken during a reflow soldering process.

Accordingly, the present application describes many technical benefits including, but not limited to, enabling a PCB to be reused multiple times for reflow profiling, enabling more accurate temperature readings during a reflow soldering process when compared with current solutions and improving solder connectivity while reducing the occurrence of solder defects.

These and other examples will be shown and described in greater detail with respect to FIG. 1-FIG. 6.

FIG. 1 illustrates a printed circuit board (PCB) 100 having a connection pad that is identified as a temperature profiling connection pad 105 according to an example. The temperature profiling connection pad 105 is part of a grid of connection pads 110 provided on a surface of the PCB 100. In another example, the connection pad may be any type of connection pad that is adapted to receive a surface mount device or component.

In an example, each connection pad in the grid of connection pads 110, including the temperature profiling connection pad 105, is made of copper. Although copper is specifically mentioned, the connection pads may be made from other materials. Additionally, although the particular connection pad is shown and referred to as the temperature profiling connection pad 105, any connection pad in the grid of connection pads 110 may be selected or otherwise identified as the temperature profiling connection pad 105.

In an example, the temperature profiling connection pad 105 is selected or is otherwise identified as the temperature profiling connection pad 105 based on one or more factors. These factors may include, but are not limited to: a location of the temperature profiling connection pad 105 in the grid of connection pads 110; and/or a type of connection pin or connection point to which the temperature profiling connection pad 105 will be coupled. For example, a location of the temperature profiling connection pad 105 may be based, at least in part, on a design or connection pin layout of an electronic component.

Each connection pad in the grid of connection pads 110 is adapted to receive or otherwise be coupled to respective connection pins or connection points in a grid of connection points associated with an electronic component. In an example, the electronic component may have a number of different types of connection pins or connection points. These include, but are not limited to, a ground pin, a no-connect pin, a do not connect pin, a do not use pin, a non-critical pin, a power pin, a data pin, a control pin and/or a clock pin. Although specific types of connection pins or connection points are mentioned, the electronic component may have various connection points that are left unconnected from any internal circuity of the electronic component.

In the example shown in FIG. 1, the particular connection pad that is identified as the temperature profiling connection pad 105 is selected based on: its location (e.g., it is at or near a center of the grid of connection pads); and a determination that the temperature profiling connection pad 105 will be coupled to a no-connect pin of an electronic component when the electronic component is surface mounted to the PCB 100.

In an example, the PCB 100 also includes traces 115 that extend from the temperature profiling connection pad 105. The traces 115 may be made from copper or another conductive material.

The PCB may also include test pads 120. In an example, the test pads 120 are provided or otherwise located at or near a perimeter of the grid of connection pads 110. In another example, the one or more test pads 120 may be provided at or near any exposed surface of the PCB 100.

As shown in FIG. 1, the traces 115 extend from the temperature profiling connection pad 105 to the test pads 120. For example, a first trace may extend from the temperature profiling connection pad 105 and be electrically and/or communicatively coupled to a first test pad. Likewise, a second trace may extend from the temperature profiling connection pad 105 and be electrically and/or communicatively coupled to a second test pad.

As will be explained in greater detail herein, the test pads 120 are adapted to be coupled to a temperature measurement device. For example, wires of the temperature measurement device may be electrically and/or communicatively coupled to the test pads 120 prior to a reflow soldering process. The temperature measurement device may then take accurate temperature readings at one or more test locations on the PCB 100 during the reflow soldering process.

In an example, the test pads 120, like the traces 115 and/or the temperature profiling connection pad 105, are made from copper. Additionally, the wires of the temperature measurement device may also be made from copper. The wires of the temperature measurement device may also be soldered to the test pads 120 and/or covered with an epoxy (or another insulation material) which may act as a heat insulation material. Accordingly, a more accurate temperature reading may be obtained when compared with current solutions.

In an example, the traces 115 may be routed to the test pads 120 using different routing configurations. For example, FIG. 2A illustrates a first routing configuration 200 for the traces 115 that extend from the temperature profiling connection pad 105 of FIG. 1 and FIG. 2B illustrates a second routing configuration 210 for the traces 115 that extend from the temperature profiling connection pad 105 of FIG. 1.

Figure 2A:
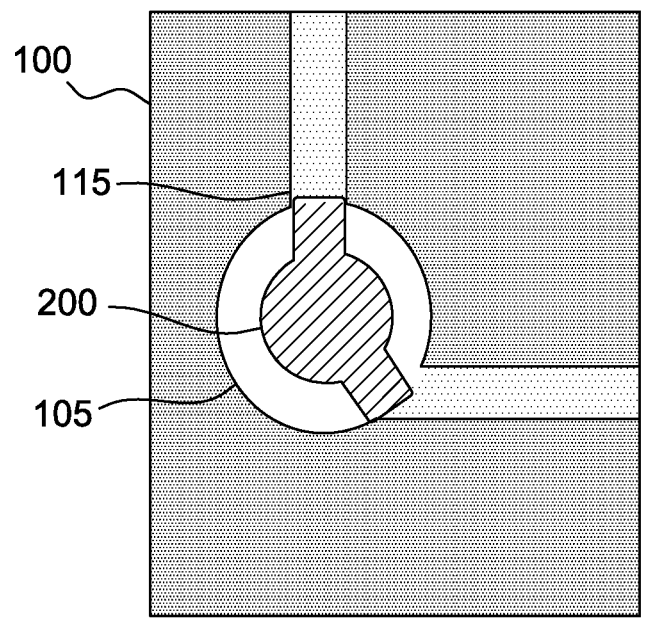
FIG. 2A illustrates a first routing configuration for the traces that extend from the temperature profiling connection pad of FIG. 1 according to an example.

In the example shown in FIG. 2A, the traces 115 extend from the temperature profiling connection pad 105 in a dual trace configuration. For example, the traces 115 may include a first trace and a second trace. The first trace and the second trace may be separate from each other and extend from the temperature profiling connection pad 105 on, through, an/or within the PCB 100. Each trace may also be coupled to corresponding test pads (e.g., test pads 120 (FIG. 1)).

Figure 2B:
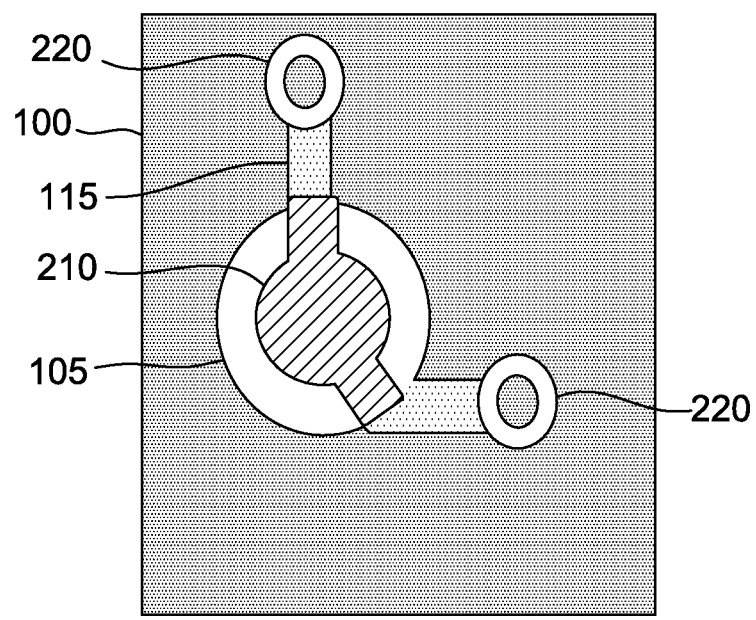
FIG. 2B illustrates a second routing configuration for the traces that extend from the temperature profiling connection pad of FIG. 1 according to an example.

In the example shown in FIG. 2B, the traces 115 extend from the temperature profiling connection pad 105 in a double dog bone configuration. In this example, one or more vias 220 associated with the double dog bone configuration may be used to route the traces 115 through different layers of the PCB 100. The traces 115 may then be coupled to corresponding test pads (e.g., test pads 120 (FIG. 1)) such as previously described. Although two different routing configurations are shown and described, other routing configurations may be used.

Referring back to FIG. 1, in an example, the PCB 100 may include multiple grids of connection pads. For example, the PCB 100 may include a second grid of connection pads 125 and a third grid of connection pads 130. The second grid of connection pads 125 and the third grid of connection pads 130 include various connection pads that are used to electrically and/or communicatively couple the PCB 100 to an electronic component or a computing component that is adapted to be surface mounted on the PCB. Additionally, the second grid of connection pads 125 and/or the third grid of connection pads 130 may include one or more temperature profiling connection pads.

Each connection pad in the second grid of connection pads 125 and the third grid of connection pads 130 may be made of copper or another conductive material. Additionally, each connection pad may have a shape and/or size that conforms to, or substantially matches, a shape and/or size of one or more connection points of the electronic component that will be surface mounted to the PCB 100.

Figure 3A:
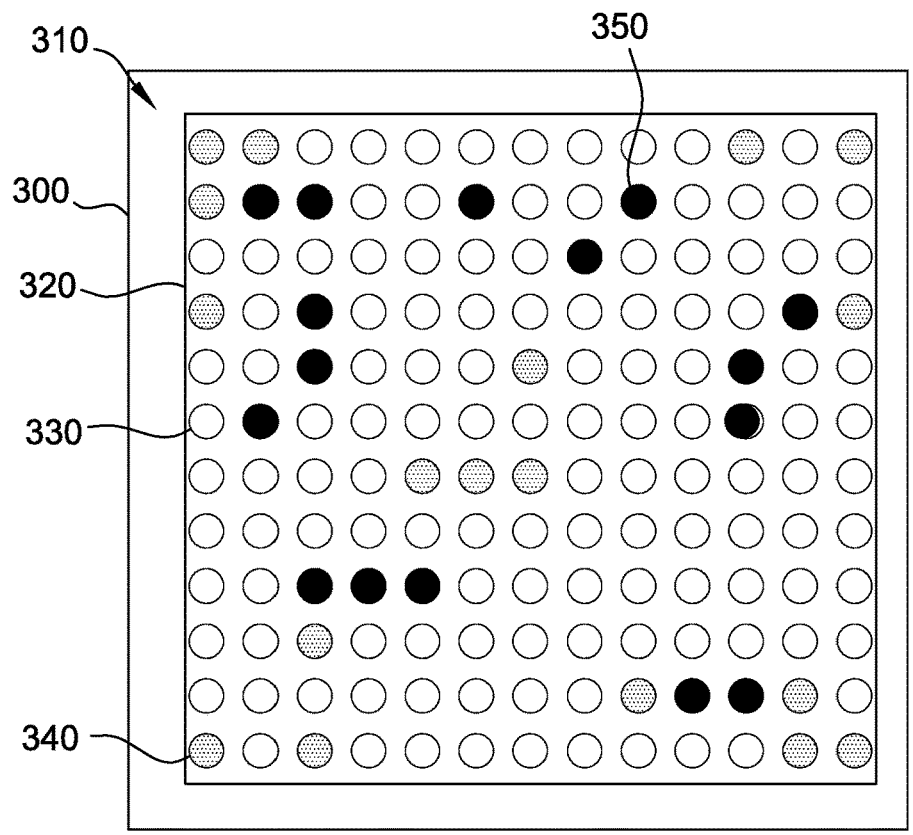
FIG. 3A illustrates an electronic component having a grid of connection points according to an example.

FIG. 3A illustrates an electronic component 300 having a grid of connection points 310 according to an example. The electronic component 300 may be an integrated circuit, a semiconductor die, a computing component or an electronic component. When the electronic component 300 is surface mounted to a PCB (e.g., PCB 100 (FIG. 1)), each connection point in the grid of connection points 310 is coupled to a corresponding connection pad on the PCB.

The grid of connection points 310 may be a grid of solder balls or bumps that are arranged on a substrate 320 of the electronic component 300. Although solder balls or bumps are specifically mentioned, the grid of connection points 310 may be any mechanism that enables the electronic component 300 to be interconnected with the PCB.

In an example, each solder ball is associated with a signal pin. Further, the electronic component 300 may have various types of signals pins. Each type of signal pin may be responsible for carrying or otherwise providing different types of signals between the electronic component 300 and the PCB.

For example, a solder ball may be associated with a ground pin, a no-connect pin, a do not connect pin, a do not use pin, a non-critical pin, a power pin, a data pin, a control pin or a clock pin. In the example, shown in FIG. 3A, the grid of connection points 310 includes at least one solder ball 330 having or otherwise being associated with a first signal pin type (e.g., a data pin, a power pin, a control pin), at least one solder ball 340 having or otherwise being associated with a second pin type (e.g., a no-connect pin), and at least one solder ball 350 having or otherwise being associated with a third pin type (e.g., a floating pin). In an example, the arrangement of some, or all of the various solder balls, and their associated signal pins, may be random, semi-random, or dependent on a design of the electronic component 300 and/or a design of the PCB on which the electronic component 300 will be mounted. In an example, pin mapping may be used to identify which signal pins associated with the electronic component 300 will be coupled to the various pads on the PCB.

Figure 3B:
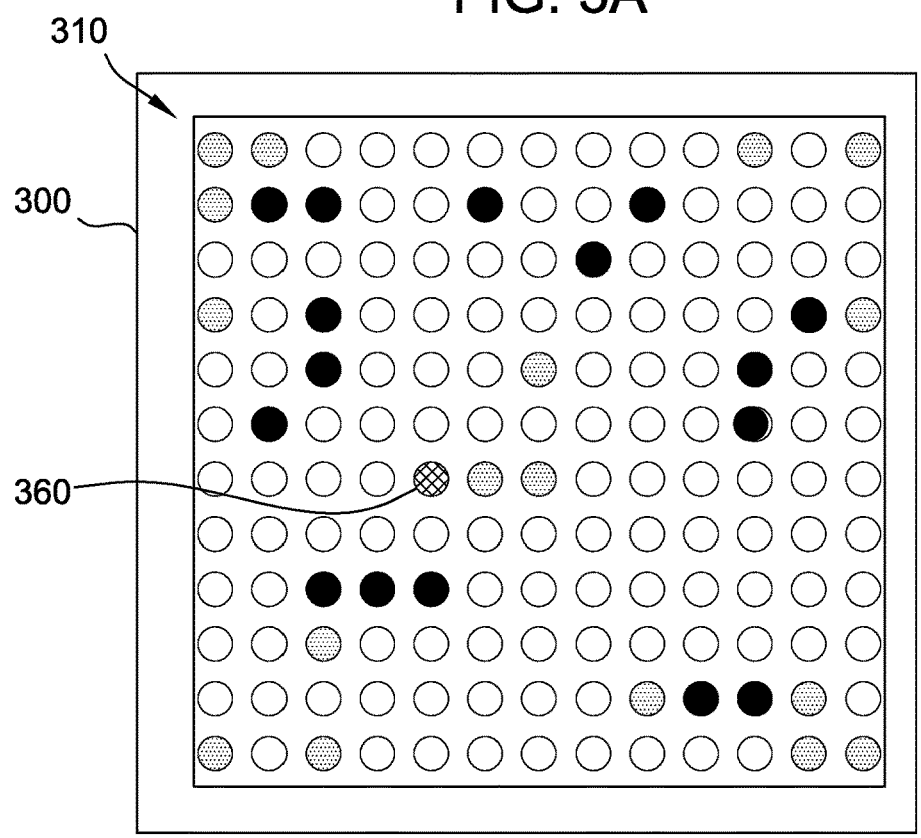
FIG. 3B illustrates a connection point from the grid of connection points being identified as a temperature profiling connection point according to an example.

FIG. 3B illustrates a connection point from the grid of connection points 310 being identified as a temperature profiling connection point 360 according to an example. As with the temperature profiling connection pad 105, the temperature profiling connection point 360 may be selected or otherwise identified as the temperature profiling connection point 360 based on one or more factors. These factors may include, but are not limited to: a design of the electronic component 300, a location of the temperature profiling connection point 360 in the grid of connection points 310;

and/or a type of the connection point that is identified as the temperature profiling connection point 360.

In this example shown in FIG. 3B, the temperature profiling connection point 360 is a no-connect pin. Additionally, the temperature profiling connection point 360 is located at or near a center of the grid of connection points 310. In an example, when the electronic component 300 is mounted to the PCB (e.g., PCB 100 (FIG. 1)), the temperature profiling connection point 360 will be coupled to a corresponding temperature profiling connection pad (e.g., the temperature profiling connection pad 105 (FIG. 1)). Although a particular connection point is identified as the temperature profiling connection point 360, any of the no-connect or floating connection points in the grid of connection points 310 may be identified or selected as the temperature profiling connection point 360.

Figure 4:
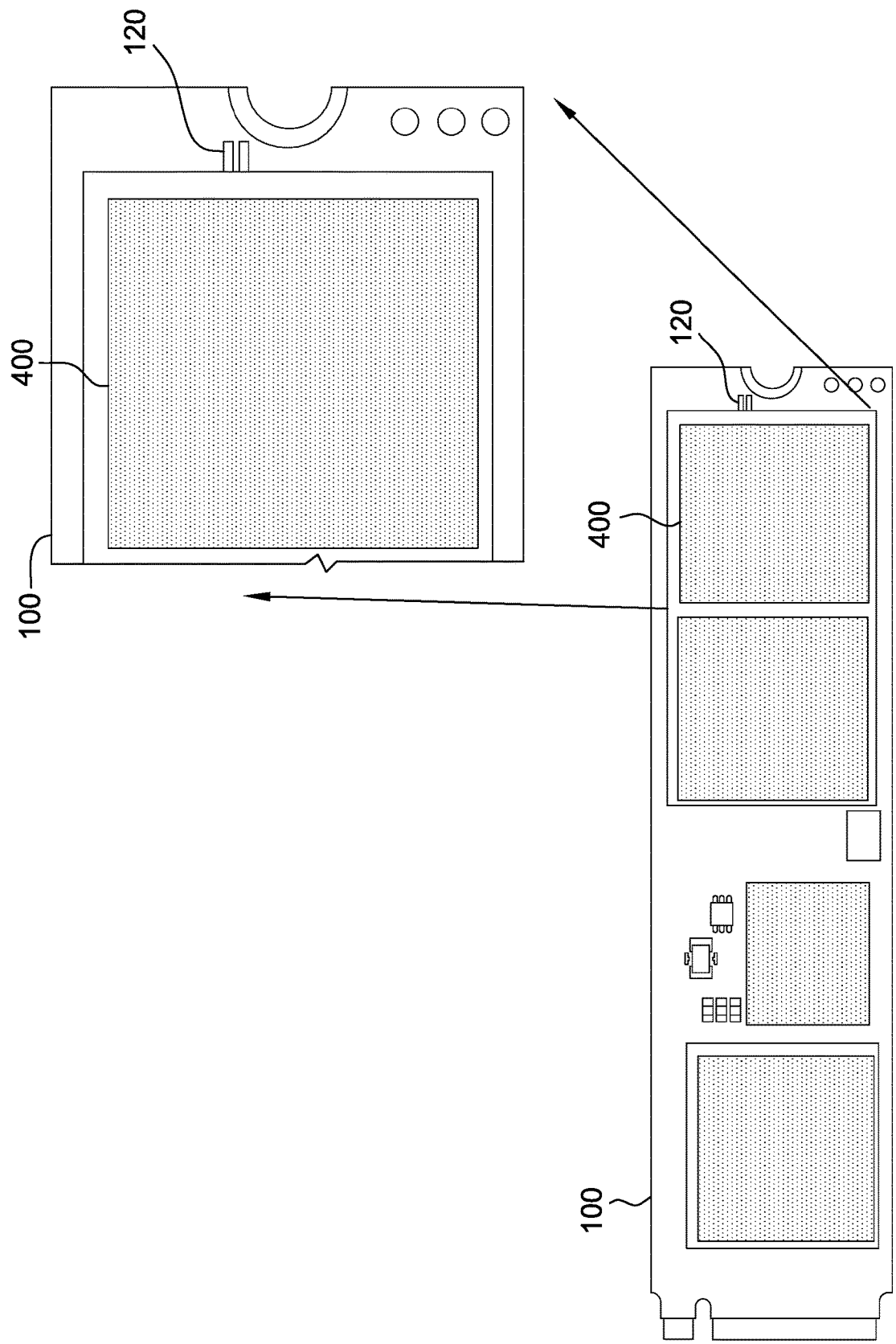
FIG. 4 illustrates an electronic component being surface mounted to the PCB of FIG. 1 according to an example.

FIG. 4 illustrates an electronic component 400 being surface mounted to the PCB 100 of FIG. 1 according to an example. The electronic component 400 may be similar to the electronic component 300 shown and described with respect to FIG. 1. As such, a temperature profiling connection point (e.g., the temperature profiling connection point 360 (FIG. 3)) may be coupled to the temperature profiling connection pad 105 of the PCB 100.

Additionally, traces 115 (FIG. 1) may extend from the temperature profiling connection pad 105 to the test pads 120. As shown in FIG. 4, the test pads 120 are accessible even when the electronic component 400 is surface mounted to the PCB 100.

Accordingly, a temperature measurement device (e.g., a thermocouple) may be coupled to the test pads 120 and used to measure a temperature of solder at or near the temperature profiling connection point during a reflow soldering process. Thus, unlike current solutions in which a hole is drilled through the PCB 100, the traces 115 and the test pads 120 enable a temperature measurement device to read a temperature at or near virtually any location on the PCB 100 and/or under the electronic component 400 without drilling any holes or otherwise damaging the PCB 100.

In some examples, the traces 115 may be removed from the PCB 100 after reflow profiling. In another example, the test pads 120 may be covered or otherwise be associated with indicators or markings that indicate the pads are for testing use only. Thus, after reflow profiling of the PCB 100 and its electronic components 400, the package may be sold or used for other purposes.

Figure 5:
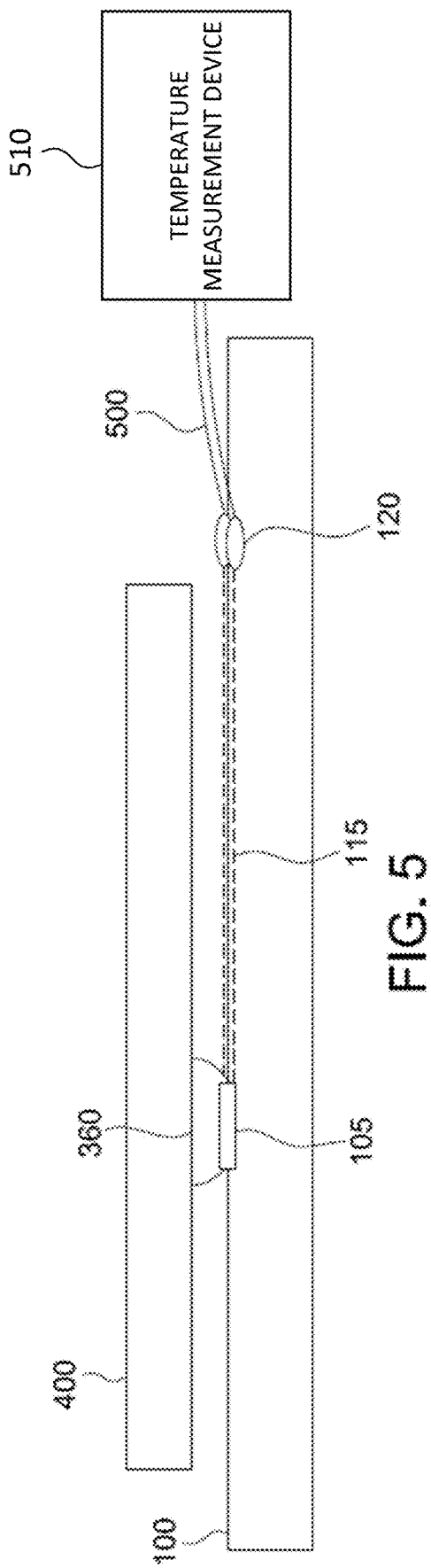
FIG. 5 illustrates a partial side cross-section view of the PCB and the electronic component of FIG. 4 according to an example.

FIG. 5 illustrates a partial side cross-section view of the PCB 100 and the electronic component 400 of FIG. 4 according to an example. As previously indicated, the electronic component of FIG. 4 may be similar to the electronic component 300 of FIG. 3. Accordingly, similar reference numbers are used for the temperature profiling connection point 360.

As shown in FIG. 5, when the electronic component 400 is surface mounted to the PCB 100, the temperature profiling connection point 360 is coupled to the temperature profiling connection pad 105. Traces 115 extend from the temperature profiling connection pad 105 to the test pads 120 provided on an exposed surface of the substrate 100.

In an example, wires 500 of a temperature measurement device 510 are coupled to the test pads 120. The wires 500 may be soldered or otherwise coupled to the test pads 120. Additionally, the test pads 120 and the wires 500 may be coated with an epoxy or other thermal insulation material to help ensure an accurate temperature measurement is taken. A reflow soldering process may be initiated and reflow profiling may commence.

Figure 6:
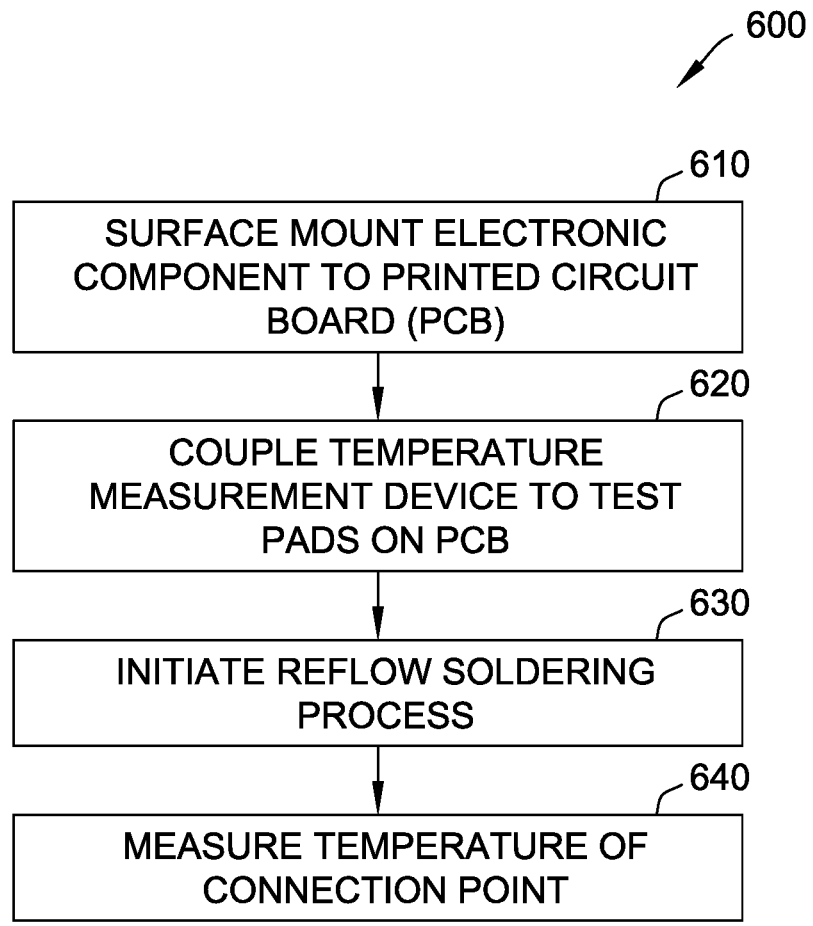
FIG. 6 illustrates a method for performing a reflow profiling process according to an example.

FIG. 6 illustrates a method 600 for performing a reflow profiling process according to an example. The method 600 may be performed using a printed circuit board (PCB) having an identified temperature profiling connection pad (e.g., the temperature profiling connection pad 105 (FIG. 1)) and corresponding traces (e.g., traces 115) and/or test pads (e.g., test pads 120). Likewise, an electronic component that is surface mounted to the PCB has a connection point that has been identified as a temperature profiling connection point (e.g., the temperature profiling connection point 360 (FIG. 3B)) that will align with the temperature profiling connection pad.

Method 600 begins when an electronic component is surface mounted 610 to a PCB. In an example, the electronic component may be an integrated circuit having a grid of connection points provided on a bottom surface. Additionally, at least one connection point in the grid of connection points has been identified as a temperature profiling connection point. As previously discussed, the temperature profiling connection point aligns with the temperature profiling connection pad when the electronic component is surface mounted to the PCB.

In addition to surface mounting the electronic component to the PCB, a temperature measurement device is electrically and/or communicatively coupled (620) to test pads on the PCB. In an example, one or more wires of the temperature measurement device are soldered or otherwise coupled to the test pads. When the wires have been coupled to the test pads, an insulation material may be provided over the wires and the test pads to help ensure an accurate temperature reading is taken during a subsequent reflow soldering process.

When the temperature measurement device is coupled to the test pads, a reflow soldering process is initiated (630). One or more temperature measurements (640) may then be taken at or near a temperature profiling connection point.

Accordingly, examples of the present disclosure describe a printed circuit board (PCB), comprising: a grid of connection pads, each connection pad of the grid of connection pads receiving a corresponding connection point from a grid of connection points associated with an electronic component when the electronic component is surface mounted to the PCB; a test pad positioned at a perimeter of the grid of connection points, the test pad acting as an attachment point for a temperature measurement device; and a trace extending from an identified connection pad of the grid of connection pads to the test pad. In an example, the identified connection pad is located proximate to a center of the grid of connection pads. In an example, the identified connection pad is associated with a no-connect connection point from the grid of connection points. In an example, the trace extends from the identified connection pad in a dual trace configuration. In an example, the trace extends from the identified connection pad using a double dog bone configuration. In an example, a wire of the temperature measurement device is soldered to the test pad. In an example, the wire of the temperature measurement device and the test pad are at least partially covered with an insulation material. In an example, the trace and a wire of the temperature measurement device are formed from copper.

Other examples describe a method, comprising: surface mounting an electronic component having a grid of connection points to a printed circuit board (PCB) having a corresponding grid of connection pads; coupling a temperature measurement device to test pads provided on a perimeter of the grid of connection pads, the test pads electrically coupled to traces extending from an identified connection pad of the grid of connection pads; performing a reflow soldering process; and measuring a temperature of a connection point associated with the identified connection pad during the reflow soldering process using the temperature measurement device. In an example, coupling the temperature measurement device to the test pads comprises soldering wires of the temperature measurement device to the test pads. In an example, the method also includes thermally insulating the wires of the temperature measurement device and the test pads. In an example, the identified connection pad is proximate to a center of the grid of connection pads. In an example, the connection point associated with the identified connection pad is selected from a group of connection points comprising: a no-connect connection point; a do not connect connection point; and a do not use connection point. In an example, the traces and wires of the temperature measurement device are formed from copper. In an example, the traces extend from the identified connection pad in a dual trace configuration. In an example, the traces extend from the identified connection pad using a double dog bone configuration.

In yet another example, a PCB is described. The PCB comprises: a grid of connection means adapted to receive interconnection means associated with an integrated circuit; a testing means positioned at a perimeter of the grid of connection means, the testing means adapted to receive wires of a temperature measurement means; and a conducting means extending from an identified connection means of the grid of connection means to the testing means, the identified connection means located proximate to a center of the grid of connection means. In an example, the identified connection means is adapted to receive a particular interconnection means associated with the integrated circuit. In an example, the particular interconnection means is selected from a group comprising: a no-connect interconnection means; a do not connect interconnection means; and a do not use interconnection means. In an example, the conducting means and the wires of the temperature measurement means are formed from copper.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A printed circuit board (PCB), comprising:
   a grid of connection pads, each connection pad of the grid of connection pads receiving a corresponding connection point from a grid of connection points associated with an electronic component when the electronic component is surface mounted to the PCB;
   a test pad positioned proximate to a perimeter of the grid of connection pads, the test pad acting as an attachment point for a temperature measurement device that measures a temperature proximate to an identified connection pad of the grid of connection pads; and
   a trace extending from the identified connection pad of the grid of connection pads to the test pad.

2. The PCB of claim 1, wherein the identified connection pad is located proximate to a center of the grid of connection pads.

3. The PCB of claim 1, wherein the identified connection pad is associated with a no-connect connection point from the grid of connection points.

4. The PCB of claim 1, wherein the trace extends from the identified connection pad in a dual trace configuration.

5. The PCB of claim 1, wherein the trace extends from the identified connection pad using a double dog bone configuration.

6. The PCB of claim 1, wherein a wire of the temperature measurement device is soldered to the test pad.

7. The PCB of claim 6, wherein the wire of the temperature measurement device and the test pad are at least partially covered with an insulation material.

8. The PCB of claim 1, wherein the trace and a wire of the temperature measurement device are formed from copper.

9. A printed circuit board (PCB), comprising:
   a grid of connection means adapted to receive interconnection means associated with an integrated circuit;
   a testing means positioned proximate to a perimeter of the grid of connection means, the testing means adapted to receive wires of a temperature measurement means that measures a temperature proximate to an identified connection means of the grid of connection means; and
   a conducting means extending from the identified connection means of the grid of connection means to the testing means.

10. The PCB of claim 9, wherein the identified connection means is adapted to receive a particular interconnection means associated with the integrated circuit.

11. The PCB of claim 10, wherein the particular interconnection means is selected from a group comprising:
   a no-connect interconnection means;

a do not connect interconnection means; and a do not use interconnection means.

12. The PCB of claim 10, wherein the conducting means and the wires of the temperature measurement means are formed from copper.

13. The PCB of claim 9, wherein the identified connection means is located proximate to a center of the grid of connection means.

14. A printed circuit board (PCB), comprising:

a grid of connection pads adapted to receive connection points of a grid of connection points associated with an electronic component surface mounted to the PCB;

a test pad operable to be coupled to at least a portion of a temperature measurement device that measures a temperature proximate to an identified connection pad of the grid of connection pads, the test pad located proximate to a perimeter of the grid of connection pads; and a trace extending between the identified connection pad and the test pad.

15. The PCB of claim 14, wherein the identified connection pad is in a center portion of the grid of connection pads.

16. The PCB of claim 14, wherein the identified connection pad is associated with a no-connect connection point of the grid of connection points.

17. The PCB of claim 14, wherein the trace has a dual trace configuration.

18. The PCB of claim 14, wherein the trace has a double dog bone configuration.

19. The PCB of claim 14, wherein a wire of the temperature measurement device is soldered to the test pad.

20. The PCB of claim 19, wherein the wire of the temperature measurement device and the test pad are at least partially covered with an insulation material.

* * * * *